(12) United States Patent
Khlat

(10) Patent No.: US 8,760,228 B2
(45) Date of Patent: Jun. 24, 2014

(54) DIFFERENTIAL POWER MANAGEMENT AND POWER AMPLIFIER ARCHITECTURE

(75) Inventor: Nadim Khlat, Cugnaux (FR)

(73) Assignee: RF Micro Devices, Inc., Greensboro, NC (US)

(*) Notice: Subject to any disclaimer, the term of this patent is extended or adjusted under 35 U.S.C. 154(b) by 19 days.

(21) Appl. No.: 13/531,719

(22) Filed: Jun. 25, 2012

(65) Prior Publication Data
US 2013/0162352 A1 Jun. 27, 2013

Related U.S. Application Data

(60) Provisional application No. 61/500,828, filed on Jun. 24, 2011.

(51) Int. Cl.
*H03F 3/68* (2006.01)
(52) U.S. Cl.
USPC .................................. 330/124 R; 330/195
(58) Field of Classification Search
USPC ............... 330/124 R, 127, 195, 295, 297; 455/127.1
See application file for complete search history.

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |
| 4,587,552 A | 5/1986 | Chin | |
| 4,692,889 A | 9/1987 | McNeely | |
| 4,996,500 A | 2/1991 | Larson et al. | |
| 5,311,309 A | 5/1994 | Ersoz et al. | |
| 5,317,217 A | 5/1994 | Rieger et al. | |
| 5,351,087 A | 9/1994 | Christopher et al. | |
| 5,414,614 A | 5/1995 | Fette et al. | |
| 5,420,643 A | 5/1995 | Romesburg et al. | |
| 5,486,871 A | 1/1996 | Filliman et al. | |
| 5,532,916 A | 7/1996 | Tamagawa | |
| 5,581,454 A | 12/1996 | Collins | |
| 5,646,621 A | 7/1997 | Cabler et al. | |

(Continued)

FOREIGN PATENT DOCUMENTS

| EP | 0755121 A2 | 1/1997 |
|---|---|---|
| EP | 1492227 A1 | 12/2004 |

(Continued)

OTHER PUBLICATIONS

International Preliminary Report on Patentability for PCT/US2011/044857 mailed Mar. 7, 2013, 6 pages.

(Continued)

*Primary Examiner* — Steven J Mottola
(74) *Attorney, Agent, or Firm* — Withrow & Terranova, P.L.L.C.

(57) ABSTRACT

Embodiments of the present disclosure relate to radio frequency (RF) transmitter circuitry, which includes non-inverting path power amplifier (PA) circuitry, inverting path PA circuitry, and RF transformer circuitry. The non-inverting path PA circuitry provides a non-inverting RF signal and a first power supply (PS) signal to the RF transformer circuitry, such that the first PS signal has a first ripple voltage. The inverting path PA circuitry provides an inverting RF signal and a second PS signal to the RF transformer circuitry, such that the second PS signal has a second ripple voltage. The RF transformer circuitry additively combines the non-inverting RF signal and the inverting RF signal to provide an RF output signal, such that effects of the first ripple voltage and the second ripple voltage are substantially cancelled from the RF output signal.

24 Claims, 9 Drawing Sheets

(56) References Cited

U.S. PATENT DOCUMENTS

| | | |
|---|---|---|
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,058,373 B2 | 6/2006 | Grigore |
| 7,164,893 B2 | 1/2007 | Leizerovich et al. |
| 7,200,365 B2 | 4/2007 | Watanabe et al. |
| 7,233,130 B1 | 6/2007 | Kay |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 * | 2/2011 | Lee et al. ............... 330/295 |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 * | 9/2011 | Giovannotto ............. 330/195 |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,198,941 B2 | 6/2012 | Lesso |
| 8,204,456 B2 | 6/2012 | Xu et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,659,355 B2 | 2/2014 | Henshaw et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2006/0006946 A1 | 1/2006 | Burns et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 | 12/2009 | Risbo |

(56) References Cited

U.S. PATENT DOCUMENTS

| | | |
|---|---|---|
| 2010/0017553 A1 | 1/2010 | Laurencin et al. |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0236444 A1 | 9/2012 | Srivastava et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| GB | 2484475 A | 4/2012 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006073208 A1 | 7/2006 |
| WO | 2007107919 A1 | 9/2007 |
| WO | 2007149346 A2 | 12/2007 |

OTHER PUBLICATIONS

Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Dixon, N., "Standardization boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim, D. et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm 0.55W/mm^2 2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, now Patent No. 7,884,681, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.

(56) References Cited

OTHER PUBLICATIONS

Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Notice of Allowance for U.S. Appl. No. 13/602,856, mailed Sep. 24, 2013, 9 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
International Search Report and Written Opinion for PCT/US2013/052277, mailed Jan. 7, 2014, 14 pages.
Non-Final Office Action for U.S. Appl. No. 14/022,940, mailed Dec. 20, 2013, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
International Search Report and Written Opinion for PCT/US2013/065403, mailed Feb. 5, 2014, 11 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
Non-Final Office Action for U.S. Appl. No. 13/661,552, mailed Feb. 21, 2014, 5 pages.
Examination Report for European Patent Application No. 11720630.0 issued Mar. 18, 2014, 4 pages.
International Search Report and Written Opinion for PCT/US2012/062110 issued Apr. 8, 2014, 12 pages.
Notice of Allowance for U.S. Appl. No. 12/836,307 mailed May 5, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Non-Final Office Action for U.S. Appl. No. 13/951,976 mailed Apr. 4, 2014, 7 pages.

\* cited by examiner

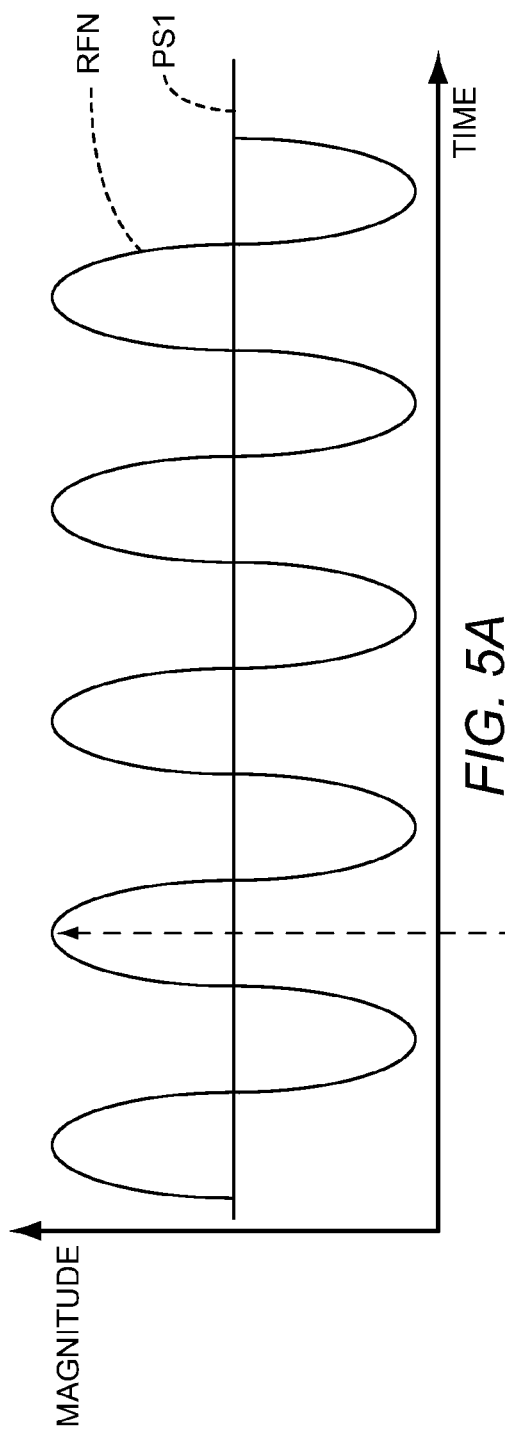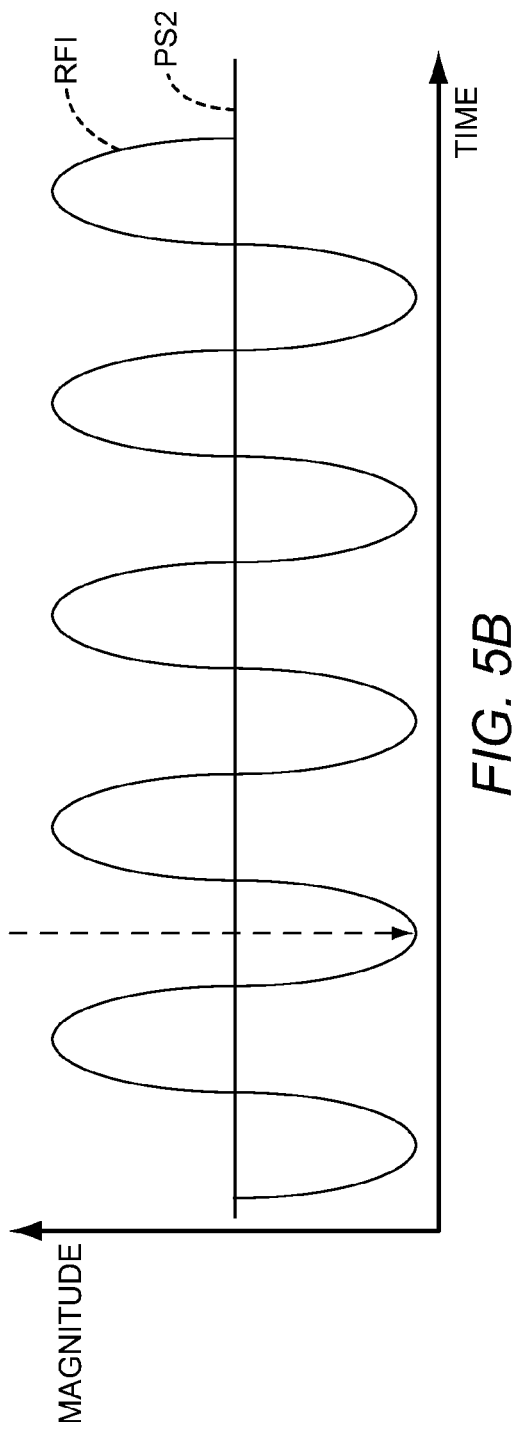

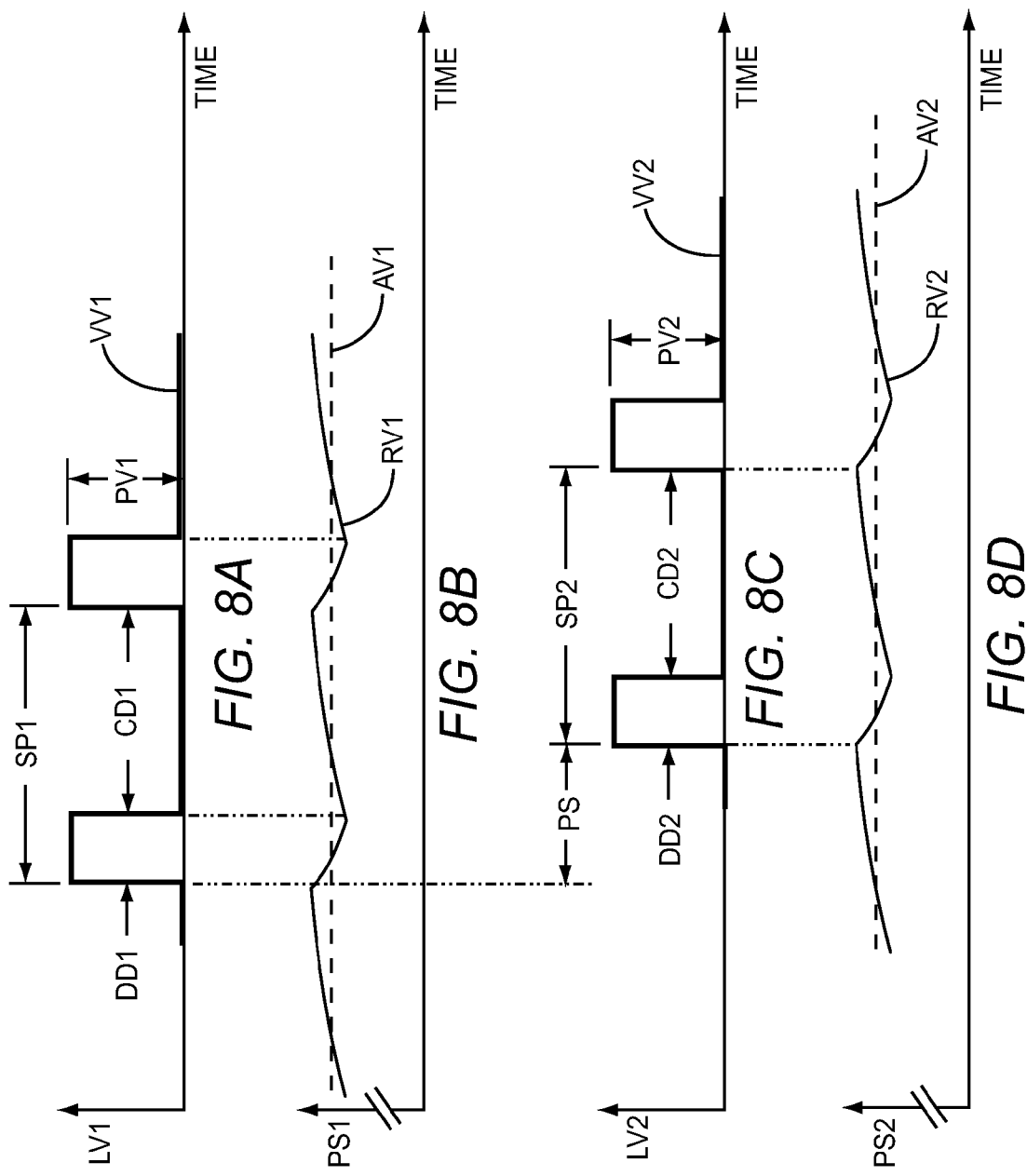

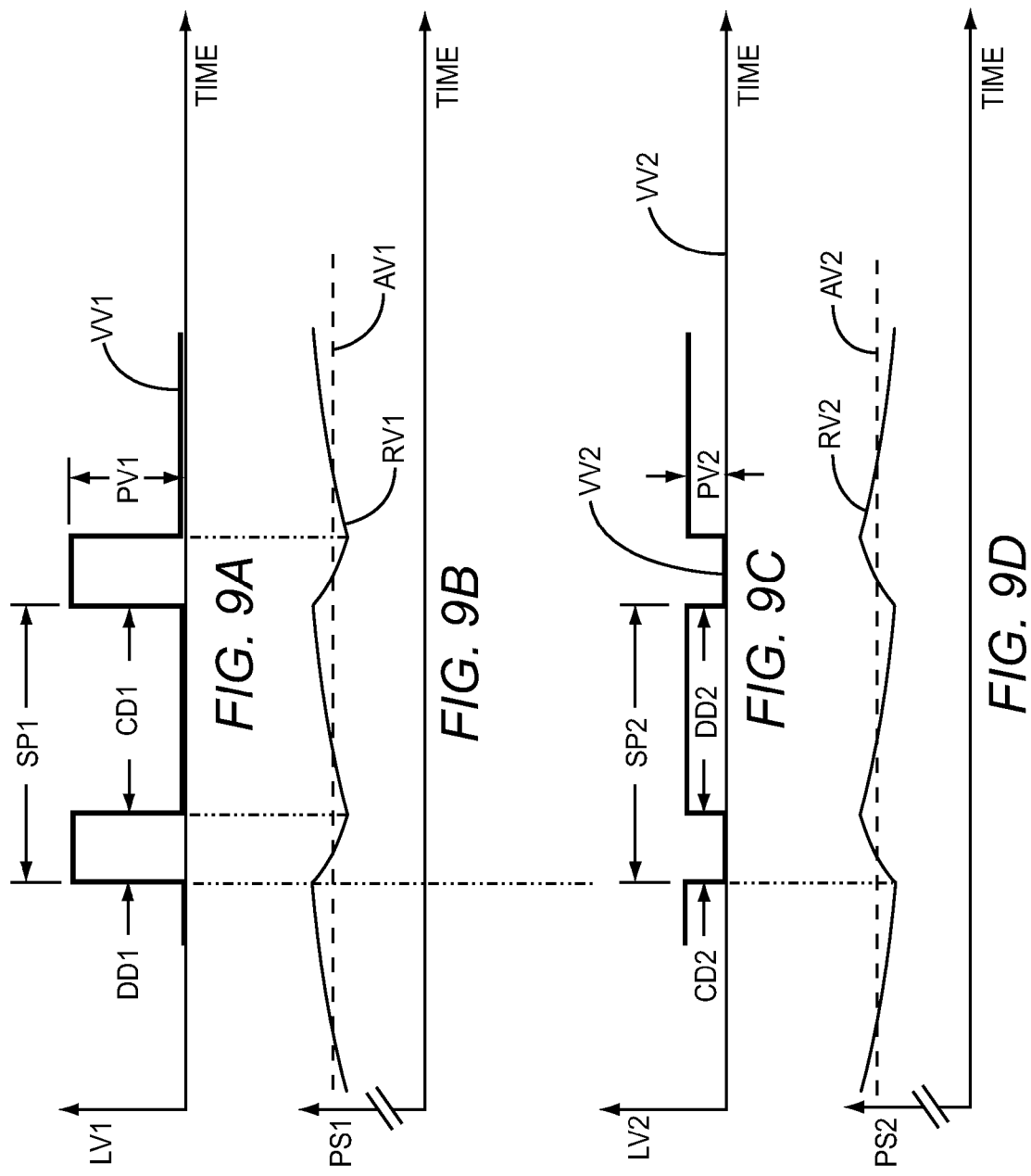

DIFFERENTIAL POWER MANAGEMENT AND POWER AMPLIFIER ARCHITECTURE

RELATED APPLICATIONS

This application claims the benefit of U.S. provisional patent application No. 61/500,828, filed Jun. 24, 2011, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and meets performance requirements.

SUMMARY

Embodiments of the present disclosure relate to RF transmitter circuitry, which includes non-inverting path power amplifier (PA) circuitry, inverting path PA circuitry, and RF transformer circuitry. The non-inverting path PA circuitry provides a non-inverting RF signal and a first power supply (PS) signal to the RF transformer circuitry, such that the first PS signal has a first ripple voltage. The inverting path PA circuitry provides an inverting RF signal and a second PS signal to the RF transformer circuitry, such that the second PS signal has a second ripple voltage. The RF transformer circuitry additively combines the non-inverting RF signal and the inverting RF signal to provide an RF output signal, such that effects of the first ripple voltage and the second ripple voltage are substantially cancelled from the RF output signal.

Together, the non-inverting path PA circuitry and the inverting path PA circuitry provide a differential PA and a differential ripple switching power supply. By using a differential architecture for both the PA and the switching power supply, costs may be reduced, size may be reduced, spurious emissions may be reduced, efficiency may be increased, and ripple rejection may be increased. Specifically, the differential PA rejects common mode interference signals and effects of the first and the second ripple voltages are largely cancelled from the RF output signal. In this regard, the differential PA and the differential ripple switching power supply may be largely integrated into a single semiconductor die, which reduces size and cost. In one embodiment of the present disclosure, the differential ripple switching power supply is an envelope tracking switching power supply, which may further increase efficiency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 5A is a graph showing a non-inverting RF signal and a first power supply (PS) signal illustrated in FIG. 4 according to one embodiment of the RF communications system.

FIG. 5B is a graph showing an inverting RF signal and a second PS signal illustrated in FIG. 4 according to one embodiment of the RF communications system.

FIG. 8A is a graph showing a first inductor input voltage illustrated in FIG. 6 according to one embodiment of the first inductor input voltage.

FIG. 8B is a graph showing the first PS signal illustrated in FIG. 6 according to one embodiment of the first PS signal.

FIG. 8C is a graph showing a second inductor input voltage illustrated in FIG. 6 according to one embodiment of the second inductor input voltage.

FIG. 8D is a graph showing the second PS signal illustrated in FIG. 6 according to one embodiment of the second PS signal.

FIG. 9A is a graph showing the first inductor input voltage illustrated in FIG. 6 according to one embodiment of the first inductor input voltage.

FIG. 9B is a graph showing the first PS signal illustrated in FIG. 6 according to one embodiment of the first PS signal.

FIG. 9C is a graph showing the second inductor input voltage illustrated in FIG. 6 according to an alternate embodiment of the second inductor input voltage.

FIG. 9D is a graph showing the second PS signal illustrated in FIG. 6 according to an alternate embodiment of the second PS signal.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to RF transmitter circuitry, which includes non-inverting path power amplifier (PA) circuitry, inverting path PA circuitry, and RF transformer circuitry. The non-inverting path PA circuitry provides a non-inverting RF signal and a first power supply (PS) signal to the RF transformer circuitry, such that the first PS signal has a first ripple voltage. The inverting path PA circuitry provides an inverting RF signal and a second PS signal to the RF transformer circuitry, such that the second PS signal has a second ripple voltage. The RF transformer circuitry additively combines the non-inverting RF signal and the inverting RF signal to provide an RF output signal, such that effects of the first ripple voltage and the second ripple voltage are substantially cancelled from the RF output signal.

Together, the non-inverting path PA circuitry and the inverting path PA circuitry provide a differential PA and a differential ripple switching power supply. By using a differential architecture for both the PA and the switching power supply, costs may be reduced, size may be reduced, spurious emissions may be reduced, efficiency may be increased, and ripple rejection may be increased. Specifically, the differential PA rejects common mode interference signals and effects of the first and the second ripple voltages are largely cancelled from the RF output signal. In this regard, the differential PA and the differential ripple switching power supply may be largely integrated into a single semiconductor die, which reduces size and cost. In one embodiment of the present disclosure, the differential ripple switching power supply is an envelope tracking switching power supply, which may further increase efficiency.

Figure 1:
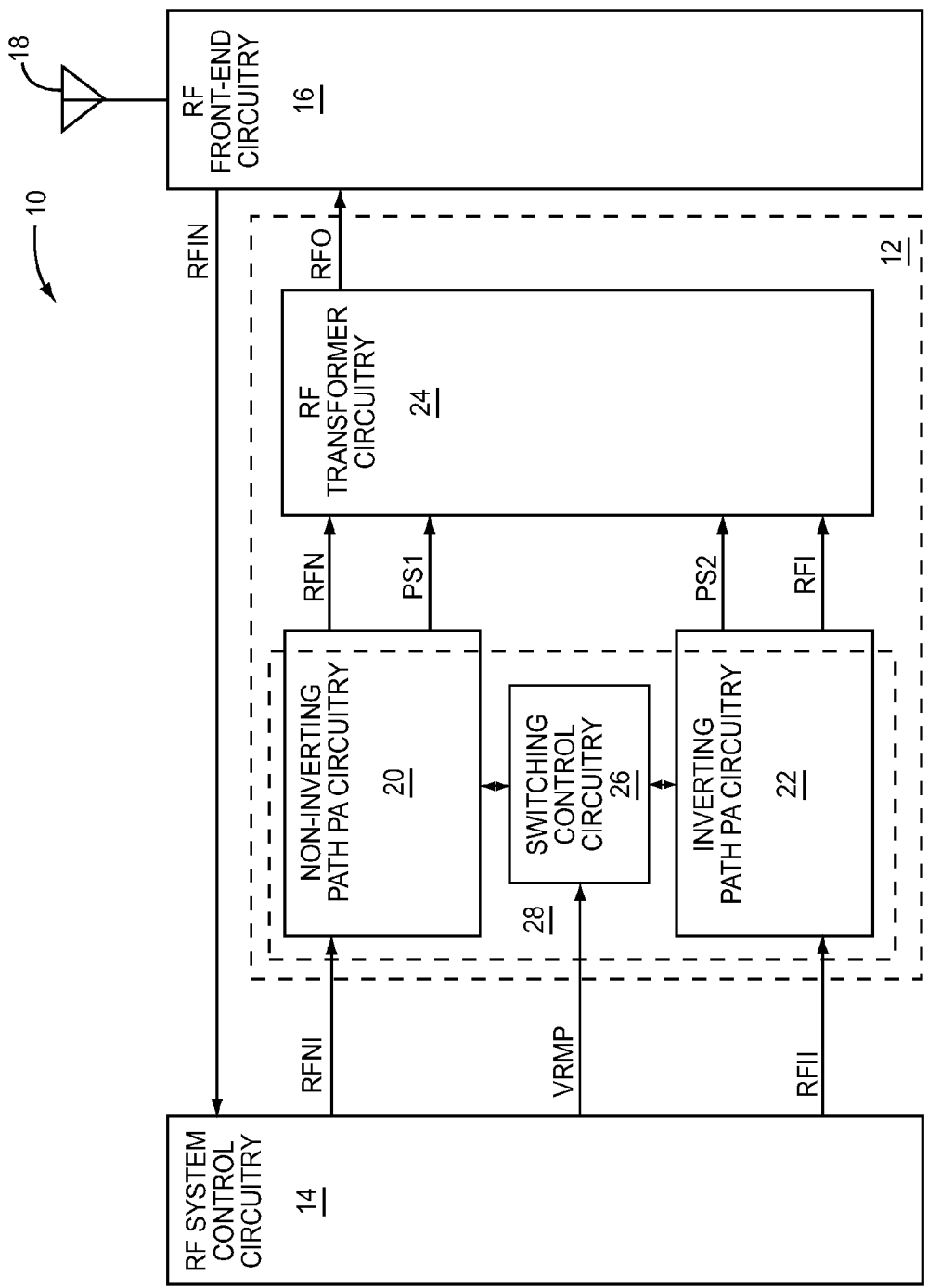
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, and an RF antenna 18. The RF transmitter circuitry 12 includes non-inverting path PA circuitry 20, inverting path PA circuitry 22, RF transformer circuitry 24, and switching control circuitry 26. In one embodiment of the RF transmitter circuitry 12, the RF transmitter circuitry 12 includes a semiconductor die 28.

In one embodiment of the semiconductor die 28, the semiconductor die 28 includes at least a portion of the non-inverting path PA circuitry 20, at least a portion of the inverting path PA circuitry 22, and at least a portion of the switching control circuitry 26. Circuit components of the non-inverting path PA circuitry 20, the inverting path PA circuitry 22, and the switching control circuitry 26 that are best not included in the semiconductor die 28, such as certain passive components, may be provided by the RF transmitter circuitry 12 in a circuit module, such as a printed circuit board (not shown). The semiconductor die 28 may be attached to the printed circuit board (not shown). In one embodiment of the semiconductor die 28, the semiconductor die 28 includes Silicon Germanium. In an alternate embodiment of the semiconductor die 28, the semiconductor die 28 is a complementary metal-oxide-semiconductor (CMOS) semiconductor die.

In one embodiment of the RF communications system 10, the RF front-end circuitry 16 receives an RF receive signal via the RF antenna 18. The RF front-end circuitry 16 provides an RF input signal RFIN to the RF system control circuitry 14 based on the RF receive signal. The RF system control circuitry 14 provides a non-inverting RF input signal RFNI to the non-inverting path PA circuitry 20 and an inverting RF input signal RFII to the inverting path PA circuitry 22. In one embodiment of the RF communications system 10, the non-inverting RF input signal RFNI and the inverting RF input signal RFII form a differential RF signal, such that the inverting RF input signal RFII is phase-shifted from the non-inverting RF input signal RFNI by about 180 degrees.

The non-inverting path PA circuitry 20 receives and amplifies the non-inverting RF input signal RFNI to provide a non-inverting RF signal RFN to the RF transformer circuitry 24. The inverting path PA circuitry 22 receives and amplifies the inverting RF input signal RFII to provide an inverting RF signal RFI to the RF transformer circuitry 24. As such, in one embodiment of the RF communications system 10, the inverting RF signal RFI is phase-shifted from the non-inverting RF signal RFN by about 180 degrees. In this regard, the non-inverting path PA circuitry 20 and the inverting path PA circuitry 22 form a differential PA, and the non-inverting RF signal RFN and the inverting RF signal RFI form a differential RF signal.

The RF system control circuitry 14 provides a power supply setpoint signal VRMP to the switching control circuitry 26. The switching control circuitry 26 exchanges signals with the non-inverting path PA circuitry 20 and with the inverting path PA circuitry 22 to provide switching power supply functionality. The non-inverting path PA circuitry 20 is coupled between the switching control circuitry 26 and the RF transformer circuitry 24. The inverting path PA circuitry 22 is coupled between the switching control circuitry 26 and the RF transformer circuitry 24.

The non-inverting path PA circuitry 20 provides a first PS signal PS1 to the RF transformer circuitry 24 based on the power supply setpoint signal VRMP. The inverting path PA circuitry 22 provides a second PS signal PS2 to the RF transformer circuitry 24 based on the power supply setpoint signal VRMP. In this regard, the power supply setpoint signal VRMP is representative of a setpoint of the first PS signal PS1 and is representative of a setpoint of the second PS signal PS2. As such, in one embodiment of the RF communications system 10, the non-inverting path PA circuitry 20, the inverting path PA circuitry 22, and the switching control circuitry 26 form a differential ripple switching power supply.

The first PS signal PS1 has a first ripple voltage RV1 (FIG. 8B). The second PS signal PS2 has a second ripple voltage RV2 (FIG. 8D). The RF transformer circuitry 24 additively combines the non-inverting RF signal RFN and the inverting RF signal RFI to provide an RF output signal RFO, such that effects of the first ripple voltage RV1 (FIG. 8B) and the second ripple voltage RV2 (FIG. 8D) are substantially cancelled from the RF output signal RFO. Since the effects of the first ripple voltage RV1 (FIG. 8B) and the second ripple voltage RV2 (FIG. 8D) are substantially cancelled, the first ripple voltage RV1 (FIG. 8B) and the second ripple voltage RV2 (FIG. 8D) behave in a differential manner. Therefore, the switching power supply is a differential ripple switching power supply. The phrase "additively combines the non-inverting RF signal RFN and the inverting RF signal RFI" means signals based on the non-inverting RF signal RFN and the inverting RF signal RFI are combined to augment one another instead of attenuate one another.

In one embodiment of the RF communications system 10, the RF output signal RFO is intended to be transmitted. As such, the RF front-end circuitry 16 provides an RF transmit signal via the RF antenna 18 based on the RF output signal RFO. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
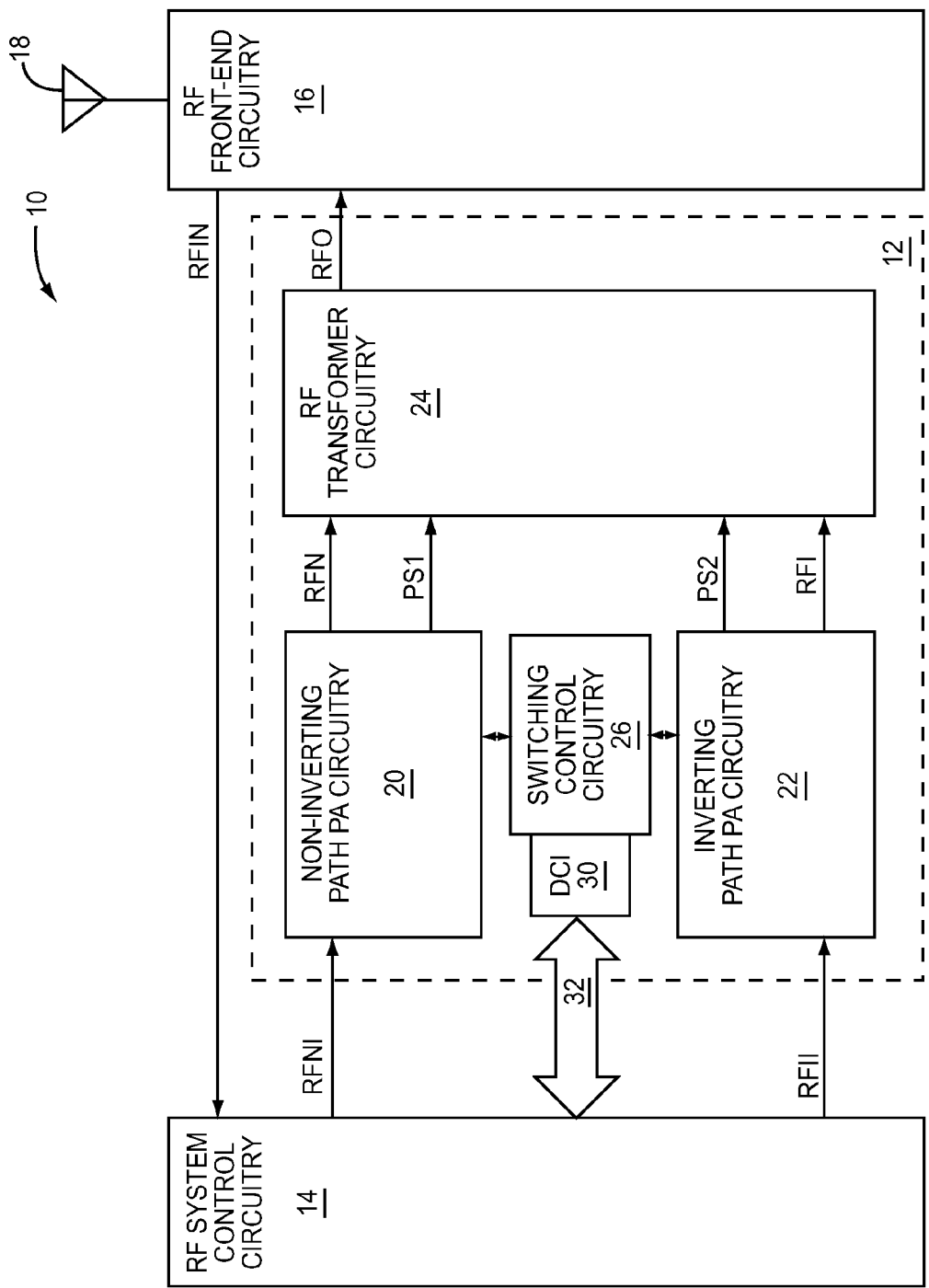
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the switching control circuitry 26 and a digital communications bus 32. The digital communications bus 32 is also coupled to the RF system control circuitry 14. As such, the RF system control circuitry 14 provides the power supply setpoint signal VRMP (FIG. 1) to the switching control circuitry 26 via the digital communications bus 32 and the digital communications interface 30.

Figure 3:
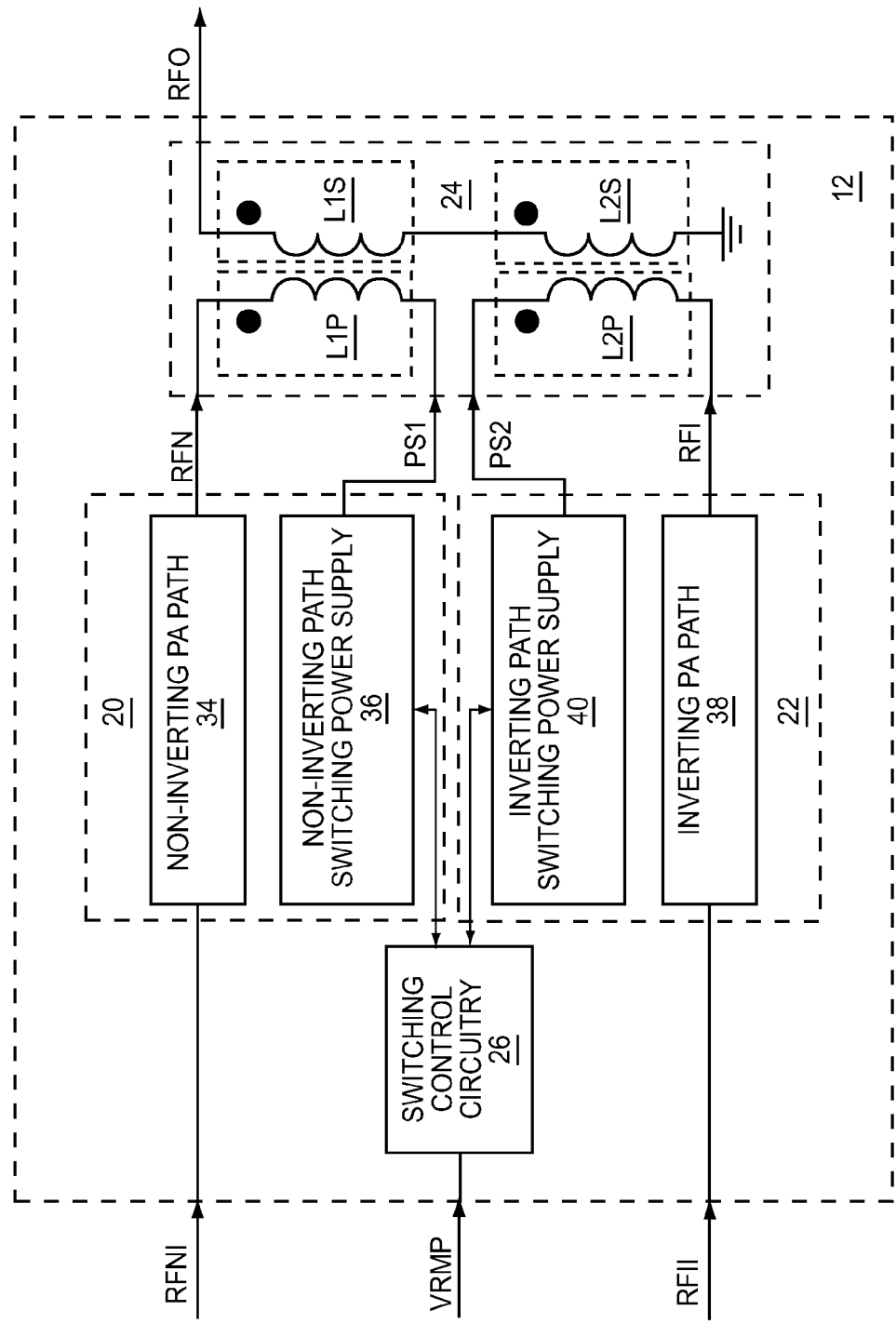
FIG. 3 shows details of RF transmitter circuitry illustrated in FIG. 1 according to one embodiment of the RF transmitter circuitry.

FIG. 3 shows details of the RF transmitter circuitry 12 illustrated in FIG. 1 according to one embodiment of the RF transmitter circuitry 12. The non-inverting path PA circuitry 20 includes a non-inverting PA path 34 and a non-inverting path switching power supply 36. The inverting path PA circuitry 22 includes an inverting PA path 38 and an inverting path switching power supply 40. The RF transformer circuitry 24 includes a first primary winding L1P, a first secondary winding L1S, a second primary winding L2P, and a second secondary winding L2S.

The non-inverting PA path 34 receives and amplifies the non-inverting RF input signal RFNI to provide the non-inverting RF signal RFN. The inverting PA path 38 receives and amplifies the inverting RF input signal RFII to provide the inverting RF signal RFI. The non-inverting path switching power supply 36 is coupled to the switching control circuitry 26 and provides the first PS signal PS1 based on the power supply setpoint signal VRMP. The inverting path switching power supply 40 is coupled to the switching control circuitry 26 and provides the second PS signal PS2 based on the power supply setpoint signal VRMP.

The first primary winding L1P receives the non-inverting RF signal RFN and the first PS signal PS1. Specifically, a first end of the first primary winding L1P receives the non-inverting RF signal RFN and a second end of the first primary winding L1P receives the first PS signal PS1. The second primary winding L2P receives the inverting RF signal RFI and the second PS signal PS2. Specifically, a first end of the second primary winding L2P receives the inverting RF signal RFI and a second end of the second primary winding L2P receives the second PS signal PS2. The first secondary winding L1S is magnetically coupled to the first primary winding L1P. The second secondary winding L2S is magnetically coupled to the second primary winding L2P. The first secondary winding L1S and the second secondary winding L2S are coupled in series and provide the RF output signal RFO.

In one embodiment of the RF transmitter circuitry 12, a first end of the first secondary winding L1S provides the RF output signal RFO. A first end of the second secondary winding L2S is coupled to a ground. A second end of the first secondary winding L1S is coupled to a second end of the second secondary winding L2S. The first end of the first secondary winding L1S is about phase-aligned to the first end of the first primary winding L1P. The first end of the second secondary winding L2S is about phase-aligned to the first end of the second primary winding L2P.

In one embodiment of the RF communications system 10, the non-inverting RF signal RFN and the inverting RF signal RFI form a differential RF signal, such that the inverting RF signal RFI is phase-shifted from the non-inverting RF signal RFN by about 180 degrees. As such, when the non-inverting RF signal RFN has a positive amplitude peak, the inverting RF signal RFI has a negative amplitude peak. However, when the non-inverting RF signal RFN has its positive amplitude peak, the first end of the first secondary winding L1S has a positive amplitude peak, and when the inverting RF signal RFI has its negative amplitude peak, the first end of the second secondary winding L2S has a negative amplitude peak. Therefore, the second end of the second secondary winding L2S has a positive amplitude peak. As such, the two positive amplitude peaks additively combine to provide the RF output signal RFO. In this regard, phasing of the windings L1P, L1S, L2P, L2S is such that a 180 degree phase-shift is applied to the inverting RF signal RFI to provide phase-alignment.

Therefore, an amplitude of the RF output signal RFO is about proportional to a sum of an amplitude of the non-inverting RF signal RFN and an amplitude of the inverting RF signal RFI. In one embodiment of the RF transformer circuitry 24, a turns ratio of the first secondary winding L1S to the first primary winding L1P is equal to about 1/1 and a turns ratio of the second secondary winding L2S to the second primary winding L2P is equal to about 1/1. As such, the amplitude of the RF output signal RFO is about equal to the sum of the amplitude of the non-inverting RF signal RFN and the amplitude of the inverting RF signal RFI.

Since the 180 degree phase-shift is applied to the inverting RF signal RFI to provide phase-alignment, in a similar manner, since the first PS signal PS1 has the first ripple voltage RV1 (FIG. 8B) and the second PS signal PS2 has the second ripple voltage RV2 (FIG. 8D), a 180 degree phase-shift is applied when combining effects of the ripple voltages RV1, RV2 (FIGS. 8B, 8D). Details of such effects will be presented when FIGS. 8B and 8D are described.

Figure 4:
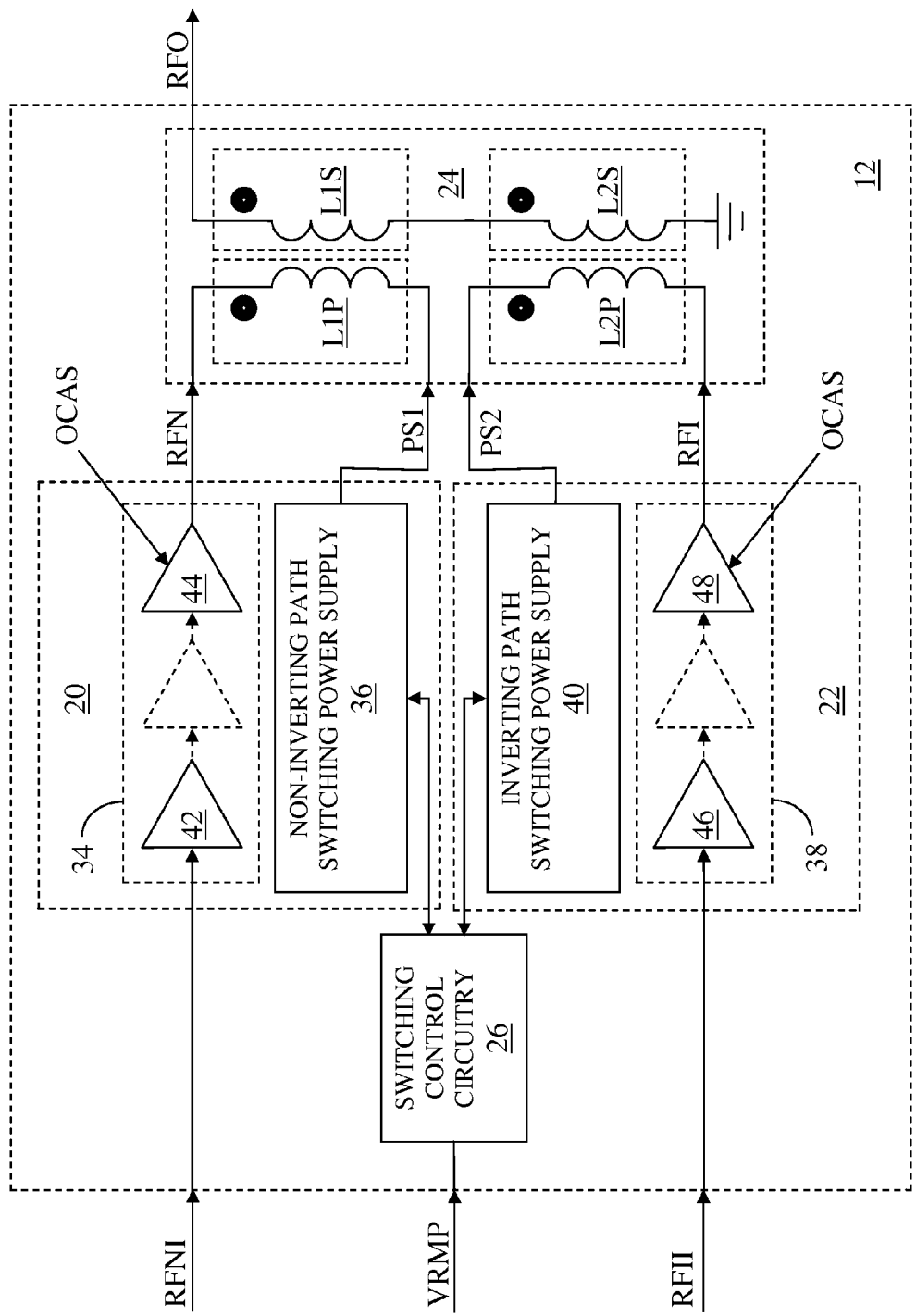
FIG. 4 shows additional details of the RF transmitter circuitry illustrated in FIG. 3 according to one embodiment of the RF transmitter circuitry.

FIG. 4 shows additional details of the RF transmitter circuitry 12 illustrated in FIG. 3 according to one embodiment of the RF transmitter circuitry 12. The RF transmitter circuitry 12 illustrated in FIG. 4 is similar to the RF transmitter circuitry 12 illustrated in FIG. 3 except the non-inverting PA path 34 includes at least a first non-inverting path driver stage 42 and a non-inverting path final stage 44 coupled in series to receive and amplify the non-inverting RF input signal RFNI to provide the non-inverting RF signal RFN. Further, the inverting PA path 38 includes at least a first inverting path driver stage 46 and an inverting path final stage 48 coupled in series to receive and amplify the inverting RF input signal RFII to provide the inverting RF signal RFI.

In this regard, the non-inverting path final stage 44 provides the non-inverting RF signal RFN and the inverting path final stage 48 provides the inverting RF signal RFI. In one embodiment of the non-inverting path final stage 44 and the inverting path final stage 48, the non-inverting path final stage 44 is an open collector amplifier stage (OCAS) and the first inverting path driver stage 46 is an OCAS. As such, the first PS signal PS1 provides power for amplification to the non-inverting path final stage 44 via the first primary winding L1P and the second PS signal PS2 provides power for amplification to the inverting path final stage 48 via the second primary winding L2P.

In one embodiment of the RF transmitter circuitry 12, the non-inverting RF signal RFN and the inverting RF signal RFI have amplitude modulation, and the first PS signal PS1 and the second PS signal PS2 are not amplitude modulated. In an alternate embodiment of the RF transmitter circuitry 12, the non-inverting RF signal RFN and the inverting RF signal RFI have amplitude modulation, and the first PS signal PS1 and the second PS signal PS2 have amplitude modulation to provide envelope tracking.

FIG. 5A is a graph showing the non-inverting RF signal RFN and the first PS signal PS1 illustrated in FIG. 4 according to one embodiment of the RF communications system 10. FIG. 5B is a graph showing the inverting RF signal RFI and the second PS signal PS2 illustrated in FIG. 4 according to one embodiment of the RF communications system 10. The inverting RF signal RFI is phase-shifted from the non-inverting RF signal RFN by about 180 degrees. The first PS signal PS1 provides a DC bias for an output of the non-inverting path final stage 44 (FIG. 4) and the second PS signal PS2 provides a DC bias for an output of the inverting path final stage 48 (FIG. 4).

Figure 6:
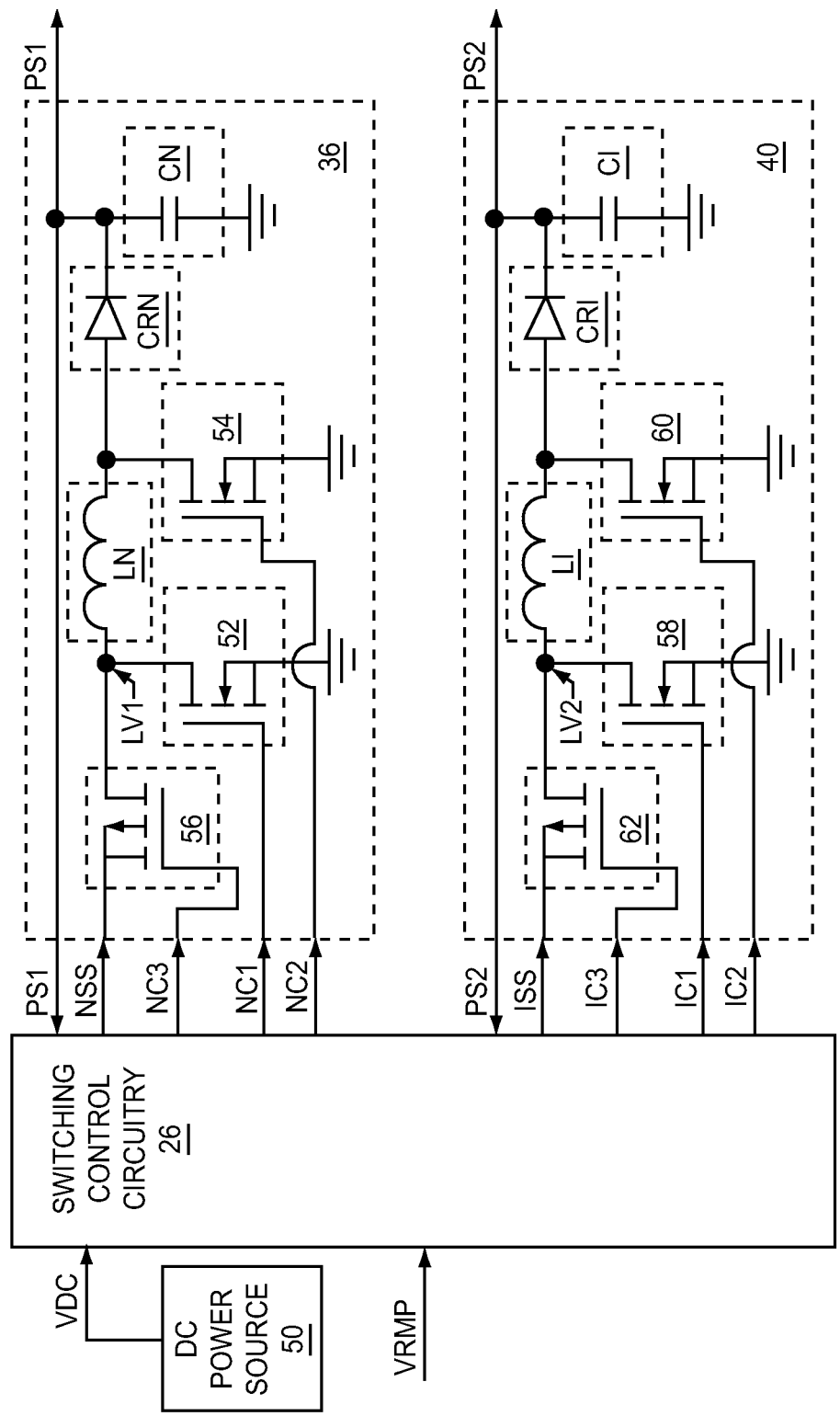
FIG. 6 shows a DC power source, switching control circuitry illustrated in FIG. 3, details of a non-inverting path switching power supply illustrated in FIG. 3, and details of an inverting path switching power supply illustrated in FIG. 3 according to one embodiment of the DC power source, the switching control circuitry, the non-inverting path switching power supply, and the inverting path switching power supply.

FIG. 6 shows a DC power source 50, the switching control circuitry 26 illustrated in FIG. 3, details of the non-inverting path switching power supply 36 illustrated in FIG. 3, and details of the inverting path switching power supply 40 illustrated in FIG. 3 according to one embodiment of the DC power source 50, the switching control circuitry 26, the non-inverting path switching power supply 36, and the inverting path switching power supply 40.

The DC power source 50 provides a DC source signal VDC to the switching control circuitry 26. In one embodiment of the DC power source 50, the DC power source 50 is a battery. The DC power source 50 may provide power for the switching control circuitry 26, the non-inverting path switching power supply 36, the inverting path switching power supply 40, the first PS signal PS1, the second PS signal PS2, or any combination thereof. The switching control circuitry 26 provides power to the non-inverting path switching power supply 36 via a non-inverting path supply signal NSS and provides power to the inverting path switching power supply 40 via an inverting path supply signal ISS.

In one embodiment of the switching control circuitry 26, a voltage of the non-inverting path supply signal NSS is about equal to a voltage of the DC source signal VDC. In an alternate embodiment of the switching control circuitry 26, the voltage of the non-inverting path supply signal NSS is greater than the voltage of the DC source signal VDC. In an additional embodiment of the switching control circuitry 26, the voltage of the non-inverting path supply signal NSS is less than the voltage of the DC source signal VDC. In one embodiment of the switching control circuitry 26, the voltage of the inverting path supply signal ISS is about equal to the voltage of the DC source signal VDC. In an alternate embodiment of the switching control circuitry 26, the voltage of the inverting path supply signal ISS is greater than the voltage of the DC source signal VDC. In an additional embodiment of the switching control circuitry 26, the voltage of the inverting path supply signal ISS is less than the voltage of the DC source signal VDC. In this regard, the switching control circuitry 26 may include charge pump circuitry, other circuitry, or both to provide voltages via the non-inverting path supply signal NSS and the inverting path supply signal ISS that are different from the voltage of the DC source signal VDC.

The non-inverting path switching power supply 36 includes a first non-inverting path switching element 52, a second non-inverting path switching element 54, a third non-inverting path switching element 56, a non-inverting path inductive element LN, a non-inverting path capacitive element CN, and a non-inverting path diode element CRN. The third non-inverting path switching element 56 is coupled between the switching control circuitry 26 and an input to the non-inverting path inductive element LN. The first non-inverting path switching element 52 is coupled between the input to the non-inverting path inductive element LN and a ground. The second non-inverting path switching element 54 is coupled between an output from the non-inverting path inductive element LN and the ground. An anode of the non-inverting path diode element CRN is coupled to the output from the non-inverting path inductive element LN. The non-inverting path capacitive element CN is coupled between a cathode of the non-inverting path diode element CRN and the ground. In general, in one embodiment of the non-inverting path switching power supply 36, the non-inverting path inductive element LN is coupled between the switching control circuitry 26 and the non-inverting path capacitive element CN.

The non-inverting path capacitive element CN provides the first PS signal PS1 to the switching control circuitry 26 and to the RF transformer circuitry 24 (FIG. 3). The switching control circuitry 26 provides the non-inverting path supply signal NSS to the third non-inverting path switching element 56. The switching control circuitry 26 provides a non-inverting path first control signal NC1 to a control input of the first non-inverting path switching element 52. The switching control circuitry 26 provides a non-inverting path second control signal NC2 to a control input of the second non-inverting path switching element 54. The switching control circuitry 26 provides a non-inverting path third control signal NC3 to a control input of the third non-inverting path switching element 56. The input to the non-inverting path inductive element LN has a first inductor input voltage LV1.

The switching control circuitry 26 selects either an ON state or an OFF state of the first non-inverting path switching element 52 via the non-inverting path first control signal NC1. The switching control circuitry 26 selects either an ON state or an OFF state of the second non-inverting path switching element 54 via the non-inverting path second control signal NC2. The switching control circuitry 26 selects either an ON state or an OFF state of the third non-inverting path switching element 56 via the non-inverting path third control signal NC3. The switching control circuitry 26 provides the non-inverting path supply signal NSS and the non-inverting path control signals NC1, NC2, NC3 as needed to regulate the first PS signal PS1 based on the setpoint of the first PS signal PS1 as represented by the power supply setpoint signal VRMP.

In one embodiment of the switching control circuitry 26 and the non-inverting path switching power supply 36, the switching control circuitry 26 and the non-inverting path switching power supply 36 operate in a buck mode. During a discharge phase of the buck mode, the first non-inverting path switching element 52 is in the OFF state, the second non-inverting path switching element 54 is in the ON state, and the third non-inverting path switching element 56 is in the ON state. The non-inverting path diode element CRN is reverse biased and the non-inverting path capacitive element CN is being discharged to provide the first PS signal PS1. Current in the non-inverting path inductive element LN is increasing due to a positive voltage at the input to the non-inverting path inductive element LN relative to the voltage at the output from the non-inverting path inductive element LN. The first inductor input voltage LV1 is about equal to a voltage of the non-inverting path supply signal NSS.

During a charge phase of the buck mode, the first non-inverting path switching element 52 is in the ON state, the second non-inverting path switching element 54 is in the OFF state, and the third non-inverting path switching element 56 is in the OFF state. The non-inverting path diode element CRN is forward biased and the non-inverting path inductive element LN provides current to charge the non-inverting path capacitive element CN and to provide the first PS signal PS1. Current in the non-inverting path inductive element LN is decreasing due to a positive voltage at the output from the non-inverting path inductive element LN relative to the voltage at the input to the non-inverting path inductive element LN. The first inductor input voltage LV1 is about equal to ground. The switching control circuitry 26 regulates the first PS signal PS1 by varying a duration of the charge phase relative to a duration of the discharge phase.

In an alternate embodiment of the switching control circuitry 26 and the non-inverting path switching power supply 36, the switching control circuitry 26 and the non-inverting path switching power supply 36 operate in a boost mode. During a discharge phase of the boost mode, the first non-inverting path switching element 52 is in the OFF state, the second non-inverting path switching element 54 is in the ON state, and the third non-inverting path switching element 56 is in the ON state. The non-inverting path diode element CRN is reverse biased and the non-inverting path capacitive element CN is being discharged to provide the first PS signal PS1. Current in the non-inverting path inductive element LN is increasing due to a positive voltage at the input to the non-inverting path inductive element LN relative to the voltage at the output from the non-inverting path inductive element LN. The first inductor input voltage LV1 is about equal to the voltage of the non-inverting path supply signal NSS.

During a charge phase of the boost mode, the first non-inverting path switching element 52 is in the OFF state, the second non-inverting path switching element 54 is in the OFF state, and the third non-inverting path switching element 56 is in the ON state. The non-inverting path diode element CRN is forward biased and the non-inverting path inductive element LN provides current to charge the non-inverting path capacitive element CN and to provide the first PS signal PS1. Current in the non-inverting path inductive element LN is decreasing due to a positive voltage at the output from the non-inverting path inductive element LN relative to the voltage to the input of the non-inverting path inductive element LN. The first inductor input voltage LV1 is about equal to the voltage of the non-inverting path supply signal NSS. The switching control circuitry 26 regulates the first PS signal PS1 by varying the duration of the charge phase relative to the duration of the discharge phase.

The inverting path switching power supply 40 includes a first inverting path switching element 58, a second inverting path switching element 60, a third inverting path switching element 62, an inverting path inductive element LI, an inverting path capacitive element CI, and an inverting path diode element CRI. The third inverting path switching element 62 is coupled between the switching control circuitry 26 and an input to the inverting path inductive element LI. The first inverting path switching element 58 is coupled between the input to the inverting path inductive element LI and the ground. The second inverting path switching element 60 is coupled between an output from the inverting path inductive element LI and the ground. An anode of the inverting path diode element CRI is coupled to the output from the inverting path inductive element LI. The inverting path capacitive element CI is coupled between a cathode of the inverting path diode element CRI and the ground. In general, in one embodiment of the inverting path switching power supply 40, the inverting path inductive element LI is coupled between the inverting path capacitive element CI and the switching control circuitry 26.

The inverting path capacitive element CI provides the second PS signal PS2 to the switching control circuitry 26 and to the RF transformer circuitry 24 (FIG. 3). The switching control circuitry 26 provides the inverting path supply signal ISS to the third inverting path switching element 62. The switching control circuitry 26 provides an inverting path first control signal IC1 to a control input of the first inverting path switching element 58. The switching control circuitry 26 provides an inverting path second control signal IC2 to a control input of the second inverting path switching element 60. The switching control circuitry 26 provides an inverting path third control signal IC3 to a control input of the third inverting path switching element 62. The input to the inverting path inductive element LI has a second inductor input voltage LV2.

The switching control circuitry 26 selects either an ON state or an OFF state of the first inverting path switching element 58 via the inverting path first control signal IC1. The switching control circuitry 26 selects either an ON state or an OFF state of the second inverting path switching element 60 via the inverting path second control signal IC2. The switching control circuitry 26 selects either an ON state or an OFF state of the third inverting path switching element 62 via the inverting path third control signal IC3. The switching control circuitry 26 provides the inverting path supply signal ISS and the inverting path control signals IC1, IC2, IC3 as needed to regulate the second PS signal PS2 based on the setpoint of the second PS signal PS2 as represented by the power supply setpoint signal VRMP.

In one embodiment of the switching control circuitry 26 and the inverting path switching power supply 40, the switching control circuitry 26 and the inverting path switching power supply 40 operate in a buck mode. During a discharge phase of the buck mode, the first inverting path switching element 58 is in the OFF state, the second inverting path switching element 60 is in the ON state, and the third inverting path switching element 62 is in the ON state. The inverting path diode element CRI is reverse biased and the inverting path capacitive element CI is being discharged to provide the second PS signal PS2. Current in the inverting path inductive element LI is increasing due to a positive voltage at the input to the inverting path inductive element LI relative to the voltage at the output from the inverting path inductive element LI. The second inductor input voltage LV2 is about equal to a voltage of the inverting path supply signal ISS.

During a charge phase of the buck mode, the first inverting path switching element 58 is in the ON state, the second inverting path switching element 60 is in the OFF state, and the third inverting path switching element 62 is in the OFF state. The inverting path diode element CRI is forward biased and the inverting path inductive element LI provides current to charge the inverting path capacitive element CI and to provide the second PS signal PS2. Current in the inverting path inductive element LI is decreasing due to a positive voltage at the output from the inverting path inductive element LI relative to the voltage at the input to the inverting path inductive element LI. The second inductor input voltage LV2 is about equal to ground. The switching control circuitry 26 regulates the second PS signal PS2 by varying a duration of the charge phase relative to a duration of the discharge phase.

In an alternate embodiment of the switching control circuitry 26 and the inverting path switching power supply 40, the switching control circuitry 26 and the inverting path switching power supply 40 operate in a boost mode. During a discharge phase of the boost mode, the first inverting path switching element 58 is in the OFF state, the second inverting path switching element 60 is in the ON state, and the third inverting path switching element 62 is in the ON state. The inverting path diode element CRI is reverse biased and the inverting path capacitive element CI is being discharged to provide the second PS signal PS2. Current in the inverting path inductive element LI is increasing due to a positive voltage at the input to the inverting path inductive element LI relative to the voltage at the output from the inverting path inductive element LI. The second inductor input voltage LV2 is about equal to the voltage of the inverting path supply signal ISS.

During a charge phase of the boost mode, the first inverting path switching element 58 is in the OFF state, the second inverting path switching element 60 is in the OFF state, and the third inverting path switching element 62 is in the ON state. The inverting path diode element CRI is forward biased and the inverting path inductive element LI provides current to charge the inverting path capacitive element CI and to provide the second PS signal PS2. Current in the inverting path inductive element LI is decreasing due to a positive voltage at the output from the inverting path inductive element LI relative to the voltage at the input to the inverting path inductive element LI. The second inductor input voltage LV2 is about equal to the voltage of the inverting path supply signal ISS. The switching control circuitry 26 regulates the second PS signal PS2 by varying the duration of the charge phase relative to the duration of the discharge phase.

Figure 7:
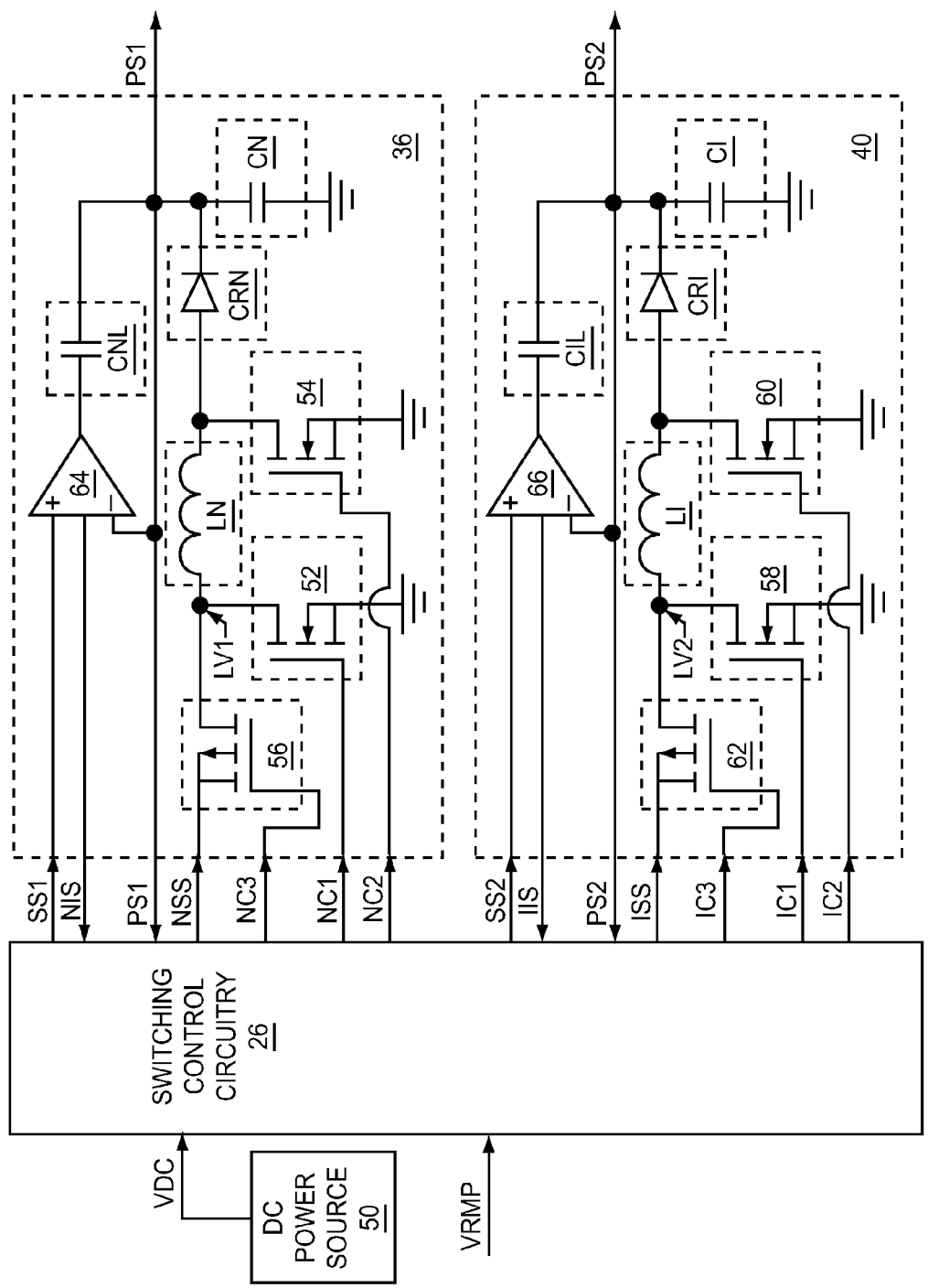
FIG. 7 shows the DC power source, the switching control circuitry illustrated in FIG. 3, details of the non-inverting path switching power supply illustrated in FIG. 3, and details of the inverting path switching power supply illustrated in FIG. 3 according to an alternate embodiment of the DC power source, the switching control circuitry, the non-inverting path switching power supply, and the inverting path switching power supply.

FIG. 7 shows the DC power source 50, the switching control circuitry 26 illustrated in FIG. 3, details of the non-inverting path switching power supply 36 illustrated in FIG. 3, and details of the inverting path switching power supply 40 illustrated in FIG. 3 according to an alternate embodiment of the DC power source 50, the switching control circuitry 26, the non-inverting path switching power supply 36, and the inverting path switching power supply 40. The DC power source 50, the switching control circuitry 26, the non-inverting path switching power supply 36, and the inverting path switching power supply 40 illustrated in FIG. 7 are similar to the DC power source 50, the switching control circuitry 26, the non-inverting path switching power supply 36, and the inverting path switching power supply 40 illustrated in FIG. 6, except the non-inverting path switching power supply 36 and the inverting path switching power supply 40 illustrated in FIG. 7 are envelope tracking power supplies.

In this regard, the non-inverting path switching power supply 36 further includes a non-inverting path parallel amplifier 64 and a non-inverting path level-shifting element CNL, and the inverting path switching power supply 40 further includes an inverting path parallel amplifier 66 and an inverting path level-shifting element CIL. An inverting input to the non-inverting path parallel amplifier 64 receives the first PS signal PS1. The switching control circuitry 26 provides a first setpoint signal SS1 to a non-inverting input to the non-inverting path parallel amplifier 64. The non-inverting path parallel amplifier 64 provides a non-inverting path current sense signal NIS to the switching control circuitry 26. The non-inverting path level-shifting element CNL is coupled between an output from the non-inverting path parallel amplifier 64 and the non-inverting path capacitive element CN.

The non-inverting path level-shifting element CNL provides a level shift between the output from the non-inverting path parallel amplifier 64 and the first PS signal PS1, such that the output from the non-inverting path parallel amplifier 64 stays within an operating range of the non-inverting path parallel amplifier 64. In an alternate embodiment of the non-inverting path switching power supply 36, the non-inverting path level-shifting element CNL is omitted, such that the output from the non-inverting path parallel amplifier 64 is directly coupled to the non-inverting path capacitive element CN. The non-inverting path current sense signal NIS is indicative of current provided by the non-inverting path parallel amplifier 64 via the output from the non-inverting path parallel amplifier 64.

The first setpoint signal SS1 provides the setpoint of the first PS signal PS1 as represented by the power supply setpoint signal VRMP. In this regard, the non-inverting path parallel amplifier 64 regulates the first PS signal PS1 to be about equal to the first setpoint signal SS1. During envelope tracking, the non-inverting RF signal RFN (FIG. 3) has amplitude modulation and the first PS signal PS1 has amplitude modulation to track an envelope of the non-inverting RF signal RFN (FIG. 3). As such, the power supply setpoint signal VRMP is amplitude modulated, which amplitude modulates the setpoint of the first PS signal PS1. As a result, the first setpoint signal SS1 is amplitude modulated.

Contributions to the first PS signal PS1 from switching circuitry in the non-inverting path switching power supply 36 may be too slow to force the first PS signal PS1 to accurately track the amplitude modulation of the non-inverting RF signal RFN (FIG. 3). Therefore, the non-inverting path parallel amplifier 64, which may be faster responding than the switching circuitry in the non-inverting path switching power supply 36, supplements the switching circuitry in the non-inverting path switching power supply 36 to accurately track the amplitude modulation of the non-inverting RF signal RFN (FIG. 3). The switching control circuitry 26 controls the switching circuitry in the non-inverting path switching power supply 36 to minimize the current provided by the non-inverting path parallel amplifier 64 as indicated by the non-inverting path current sense signal NIS. Since the non-inverting path parallel amplifier 64 may be less efficient than the switching circuitry in the non-inverting path switching power supply 36, minimizing the current provided by the non-inverting path parallel amplifier 64 may maximize efficiency while providing the first PS signal PS1 that accurately tracks the amplitude modulation of the non-inverting RF signal RFN (FIG. 3).

An inverting input to the inverting path parallel amplifier 66 receives the second PS signal PS2. The switching control circuitry 26 provides a second setpoint signal SS2 to a non-inverting input to the inverting path parallel amplifier 66. The inverting path parallel amplifier 66 provides an inverting path current sense signal IIS to the switching control circuitry 26. The inverting path level-shifting element CIL is coupled between an output from the inverting path parallel amplifier 66 and the inverting path capacitive element CI.

The inverting path level-shifting element CIL provides a level shift between the output from the inverting path parallel amplifier 66 and the second PS signal PS2, such that the output from the inverting path parallel amplifier 66 stays within an operating range of the inverting path parallel amplifier 66. In an alternate embodiment of the inverting path switching power supply 40, the inverting path level-shifting element CIL is omitted, such that the output from the inverting path parallel amplifier 66 is directly coupled to the inverting path capacitive element CI. The inverting path current sense signal IIS is indicative of current provided by the inverting path parallel amplifier 66 via the output from the inverting path parallel amplifier 66.

The second setpoint signal SS2 provides the setpoint of the second PS signal PS2 as represented by the power supply setpoint signal VRMP. In this regard, the inverting path parallel amplifier 66 regulates the second PS signal PS2 to be about equal to the second setpoint signal SS2. During envelope tracking, the inverting RF signal RFI (FIG. 3) has amplitude modulation and the second PS signal PS2 has amplitude modulation to track an envelope of the inverting RF signal RFI (FIG. 3). As such, the power supply setpoint signal VRMP is amplitude modulated, which amplitude modulates the setpoint of the second PS signal PS2. As a result, the second setpoint signal SS2 is amplitude modulated.

Contributions to the second PS signal PS2 from switching circuitry in the inverting path switching power supply 40 may be too slow to force the second PS signal PS2 to accurately track the amplitude modulation of the inverting RF signal RFI (FIG. 3). Therefore, the inverting path parallel amplifier 66, which may be faster responding than the switching circuitry in the inverting path switching power supply 40, supplements the switching circuitry in the inverting path switching power supply 40 to accurately track the amplitude modulation of the inverting RF signal RFI (FIG. 3). The switching control circuitry 26 controls the switching circuitry in the inverting path switching power supply 40 to minimize the current provided by the inverting path parallel amplifier 66 as indicated by the inverting path current sense signal IIS. Since the inverting path parallel amplifier 66 may be less efficient than the switching circuitry in the inverting path switching power supply 40, minimizing the current provided by the inverting path parallel amplifier 66 may maximize efficiency while providing the second PS signal PS2 that accurately tracks the amplitude modulation of the inverting RF signal RFI (FIG. 3).

FIG. 8A is a graph showing the first inductor input voltage LV1 illustrated in FIG. 6 according to one embodiment of the first inductor input voltage LV1. FIG. 8B is a graph showing the first PS signal PS1 illustrated in FIG. 6 according to one embodiment of the first PS signal PS1. FIG. 8C is a graph showing the second inductor input voltage LV2 illustrated in FIG. 6 according to one embodiment of the second inductor input voltage LV2. FIG. 8D is a graph showing the second PS signal PS2 illustrated in FIG. 6 according to one embodiment of the second PS signal PS2. In FIGS. 8A, 8B, 8C, and 8D, the switching control circuitry 26 (FIG. 6), the non-inverting path switching power supply 36 (FIG. 6), and the inverting path switching power supply 40 (FIG. 6) are operating in the buck mode, and the first PS signal PS1 and the second PS signal PS2 are not amplitude modulated.

Regarding FIGS. 8A and 8B, during the discharge phase of the buck mode, the non-inverting path diode element CRN (FIG. 6) is reverse biased and the non-inverting path capacitive element CN (FIG. 6) is being discharged to provide the first PS signal PS1. Current in the non-inverting path inductive element LN (FIG. 6) is increasing due to the positive voltage at the input to the non-inverting path inductive element LN (FIG. 6) relative to the voltage at the output from the non-inverting path inductive element LN (FIG. 6). Therefore, the first inductor input voltage LV1 has a first peak voltage PV1 for a first discharge duration DD1 and the first PS signal PS1 drops as the non-inverting path capacitive element CN (FIG. 6) discharges.

During the charge phase of the buck mode, the non-inverting path diode element CRN (FIG. 6) is forward biased and the non-inverting path inductive element LN (FIG. 6) provides current to charge the non-inverting path capacitive element CN (FIG. 6) and to provide the first PS signal PS1. Current in the non-inverting path inductive element LN (FIG. 6) is decreasing due to the positive voltage at the output from the non-inverting path inductive element LN (FIG. 6) relative to the voltage at the input to the non-inverting path inductive element LN (FIG. 6). Therefore, the first inductor input voltage LV1 has a first valley voltage VV1 for a first charge duration CD1 and the first PS signal PS1 increases as the non-inverting path capacitive element CN (FIG. 6) charges. In one embodiment of the first valley voltage VV1, the first valley voltage VV1 is about equal to ground. A first switching cycle period SP1 of the first inductor input voltage LV1 has the first discharge duration DD1 followed by the first charge duration CD1. The first PS signal PS1 has a first average voltage AV1 and a first ripple voltage RV1.

Regarding FIGS. 8C and 8D, during the discharge phase of the buck mode, the inverting path diode element CRI (FIG. 6) is reverse biased and the inverting path capacitive element CI (FIG. 6) is being discharged to provide the second PS signal PS2. Current in the inverting path inductive element LI (FIG. 6) is increasing due to the positive voltage at the input to the inverting path inductive element LI (FIG. 6) relative to the voltage at the output from the inverting path inductive element LI (FIG. 6). Therefore, the second inductor input voltage LV2 has a second peak voltage PV2 for a second discharge duration DD2 and the second PS signal PS2 drops as the inverting path capacitive element CI (FIG. 6) discharges.

During the charge phase of the buck mode, the inverting path diode element CRI (FIG. 6) is forward biased and the inverting path inductive element LI (FIG. 6) provides current to charge the inverting path capacitive element CI (FIG. 6) and to provide the second PS signal PS2. Current in the inverting path inductive element LI (FIG. 6) is decreasing due to the positive voltage at the output from the inverting path inductive element LI (FIG. 6) relative to the voltage at the input to the inverting path inductive element LI (FIG. 6). Therefore, the second inductor input voltage LV2 has a second valley voltage VV2 for a second charge duration CD2 and the second PS signal PS2 increases as the inverting path capacitive element CI (FIG. 6) charges. In one embodiment of the second valley voltage VV2, the second valley voltage VV2 is about equal to ground. A second switching cycle period SP2 of the second inductor input voltage LV2 has the second discharge duration DD2 followed by the second charge duration CD2. The second PS signal PS2 has a second average voltage AV2 and a second ripple voltage RV2.

The second inductor input voltage LV2 has a phase shift PS relative to the first inductor input voltage LV1. In one embodiment of the phase shift PS, the phase shift PS is equal to about 180 degrees, such that the second inductor input voltage LV2 is phase-shifted from the first inductor input voltage LV1 by about 180 degrees. In one embodiment of the first PS signal PS1 and the second PS signal PS2, the second average voltage AV2 is about equal to the first average voltage AV1. In one embodiment of the first PS signal PS1 and the second PS signal PS2, a waveshape of the second ripple voltage RV2 is about equal to a waveshape of the first ripple voltage RV1.

In one embodiment of the present disclosure, the input to the non-inverting path inductive element LN (FIG. 6) has the first inductor input voltage LV1 (FIG. 6), such that the first ripple voltage RV1 (FIG. 8B) is based on the first inductor input voltage LV1 (FIG. 6), the input to the inverting path inductive element LI (FIG. 6) has the second inductor input voltage LV2 (FIG. 6), such that the second ripple voltage RV2 (FIG. 8D) is based on the second inductor input voltage LV2 (FIG. 6), and the second inductor input voltage LV2 (FIG. 6)

is phase-shifted from the first inductor input voltage LV1 (FIG. 6) by about 180 degrees.

In one embodiment of the present disclosure, the first inductor input voltage LV1 is a periodic signal, such that during the first switching cycle period SP1, the first inductor input voltage LV1 has the first peak voltage PV1 followed by a first valley voltage VV1. The second inductor input voltage LV2 is a periodic signal, such that during the second switching cycle period SP2, the second inductor input voltage LV2 has the second peak voltage PV2 followed by the second valley voltage VV2. The second switching cycle period SP2 is about equal to the first switching cycle period SP1.

In one embodiment of the present disclosure, the first inductor input voltage LV1 has the first peak voltage PV1 for the first discharge duration DD1, the first inductor input voltage LV1 has the first valley voltage VV1 for the first charge duration CD1, the second inductor input voltage LV2 has the second peak voltage PV2 for the second discharge duration DD2, the second inductor input voltage LV2 has the second valley voltage VV2 for the second charge duration CD2, the second discharge duration DD2 is about equal to the first discharge duration DD1, the second charge duration CD2 is about equal to the first charge duration CD1, and the second peak voltage PV2 is about equal to the first peak voltage PV1.

In one embodiment of the present disclosure, the non-inverting RF signal RFN (FIG. 6) and the inverting RF signal RFI (FIG. 6) have amplitude modulation. Further, the first PS signal PS1 and the second PS signal PS2 have amplitude modulation to provide envelope tracking. However, since the second inductor input voltage LV2 (FIG. 6) may need to be phase-shifted from the first inductor input voltage LV1 (FIG. 6) by about 180 degrees and since magnitudes of the first PS signal PS1 and the second PS signal PS2 are continually changing due to the amplitude modulation, duty-cycles of the first inductor input voltage LV1 (FIG. 6) and the second inductor input voltage LV2 (FIG. 6) are continually changing, thereby introducing phase-error between the first inductor input voltage LV1 (FIG. 6) and the second inductor input voltage LV2 (FIG. 6). As a result, the phase shift PS between the first ripple voltage RV1 and the second ripple voltage RV2 is adjusted based on the amplitude modulation of the first PS signal PS1 and the second PS signal PS2.

Effects of the first ripple voltage RV1 and the second ripple voltage RV2 are presented. When the first ripple voltage RV1 is decreasing, a gain of the non-inverting path final stage 44 (FIG. 4) is decreasing, thereby decreasing an amplitude of the non-inverting RF signal RFN (FIG. 4). Conversely, when the first ripple voltage RV1 is increasing, the gain of the non-inverting path final stage 44 (FIG. 4) is increasing, thereby increasing the amplitude of the non-inverting RF signal RFN (FIG. 4). Such amplitude changes are effects of the first ripple voltage RV1. Similarly, when the second ripple voltage RV2 is decreasing, a gain of the inverting path final stage 48 (FIG. 4) is decreasing, thereby decreasing an amplitude of the inverting RF signal RFI (FIG. 4). Conversely, when the second ripple voltage RV2 is increasing, the gain of the inverting path final stage 48 (FIG. 4) is increasing, thereby increasing the amplitude of the inverting RF signal RFI (FIG. 4). Such amplitude changes are effects of the second ripple voltage RV2.

From FIGS. 8B and 8D, when the first ripple voltage RV1 is decreasing, the second ripple voltage RV2 is increasing. Similarly, when the second ripple voltage RV2 is decreasing, the first ripple voltage RV1 is increasing. Therefore, when the first ripple voltage RV1 is decreasing and the second ripple voltage RV2 is increasing, the amplitude of the non-inverting RF signal RFN (FIG. 4) is decreasing and the amplitude of the inverting RF signal RFI (FIG. 4) is increasing. However, since the RF transformer circuitry 24 (FIG. 4) combines the non-inverting RF signal RFN (FIG. 4) and the inverting RF signal RFI (FIG. 4) substantially in-phase, the decreasing amplitude of the non-inverting RF signal RFN (FIG. 4) is largely offset by the increasing amplitude of the inverting RF signal RFI (FIG. 4). As a result, effects of the first ripple voltage RV1 and the second ripple voltage RV2 are substantially cancelled from the RF output signal RFO (FIG. 4).

FIG. 9A is a graph showing the first inductor input voltage LV1 illustrated in FIG. 6 according to one embodiment of the first inductor input voltage LV1. FIG. 9B is a graph showing the first PS signal PS1 illustrated in FIG. 6 according to one embodiment of the first PS signal PS1. FIG. 9C is a graph showing the second inductor input voltage LV2 illustrated in FIG. 6 according to an alternate embodiment of the second inductor input voltage LV2. FIG. 9D is a graph showing the second PS signal PS2 illustrated in FIG. 6 according to an alternate embodiment of the second PS signal PS2.

The first inductor input voltage LV1 illustrated in FIG. 9A is equivalent to the first inductor input voltage LV1 illustrated in FIG. 8A and is repeated for clarity. Similarly, the first PS signal PS1 illustrated in FIG. 9B is equivalent to the first PS signal PS1 illustrated in FIG. 8B and is repeated for clarity. The second inductor input voltage LV2 illustrated in FIG. 9C is similar to the second inductor input voltage LV2 illustrated in FIG. 8C, except the second inductor input voltage LV2 illustrated in FIG. 9C is about phase-aligned to the first inductor input voltage LV1. The second PS signal PS2 illustrated in FIG. 9D is similar to the first PS signal PS1 illustrated in FIG. 9B, except the second ripple voltage RV2 illustrated in FIG. 9D is approximately an inversion of the first ripple voltage RV1 illustrated in FIG. 9B. By phase-aligning the first inductor input voltage LV1 and the second inductor input voltage LV2 instead of phase-shifting the first inductor input voltage LV1 and the second inductor input voltage LV2, certain timing problems may be lessened or avoided, particularly in envelope tracking applications.

In one embodiment of the present disclosure, the first inductor input voltage LV1 is a periodic signal, such that during the first switching cycle period SP1, the first inductor input voltage LV1 has the first peak voltage PV1 followed by the first valley voltage VV1. The second inductor input voltage LV2 is a periodic signal, such that during the second switching cycle period SP2, the second inductor input voltage LV2 has the second valley voltage VV2 followed by the second peak voltage PV2. The second switching cycle period SP2 is about equal to the first switching cycle period SP1. The second switching cycle period SP2 is about phase-aligned to the first switching cycle period SP1.

In one embodiment of the present disclosure, the first inductor input voltage LV1 has the first peak voltage PV1 for the first discharge duration DD1. The first inductor input voltage LV1 has the first valley voltage VV1 for the first charge duration CD1. The second inductor input voltage LV2 has the second peak voltage PV2 for the second discharge duration DD2. The second inductor input voltage LV2 has the second valley voltage VV2 for the second charge duration CD2. The second charge duration CD2 is about equal to the first discharge duration DD1. The second discharge duration DD2 is about equal to the first charge duration CD1.

In one embodiment of the present disclosure, a first difference is equal to the first peak voltage PV1 minus the first valley voltage VV1. A second difference is equal to the second peak voltage PV2 minus the second valley voltage VV2. A first product is equal to the first difference times the first discharge duration DD1. A second product is equal to the second difference times the second discharge duration DD2. The second product is about equal to the first product.

In one embodiment of the present disclosure, the first valley voltage VV1 is equal to about zero. The second valley voltage VV2 is equal to about zero. The first product is equal to the first peak voltage PV1 times the first discharge duration DD1. The second product is equal to the second peak voltage PV2 times the second discharge duration DD2. The second product is about equal to the first product.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   non-inverting path power amplifier (PA) circuitry adapted to:
      provide a non-inverting radio frequency (RF) signal to RF transformer circuitry; and
      provide a first power supply (PS) signal to the RF transformer circuitry, such that the first PS signal has a first ripple voltage;
   inverting path PA circuitry adapted to:
      provide an inverting RF signal to the RF transformer circuitry; and
      provide a second PS signal to the RF transformer circuitry, such that the second PS signal has a second ripple voltage; and
   the RF transformer circuitry adapted to additively combine the non-inverting RF signal and the inverting RF signal to provide an RF output signal, such that effects of the first ripple voltage and the second ripple voltage are substantially cancelled from the RF output signal.

2. The circuitry of claim 1 wherein an amplitude of the RF output signal is about equal to a sum of an amplitude of the non-inverting RF signal and an amplitude of the inverting RF signal.

3. The circuitry of claim 1 wherein:
   the non-inverting path PA circuitry comprises a non-inverting path final stage adapted to provide the non-inverting RF signal; and
   the inverting path PA circuitry comprises an inverting path final stage adapted to provide the inverting RF signal.

4. The circuitry of claim 3 wherein:
   the non-inverting path final stage is an open collector amplifier stage; and
   the inverting path final stage is an open collector amplifier stage.

5. The circuitry of claim 1 wherein the RF transformer circuitry comprises:
   a first primary winding adapted to receive the non-inverting RF signal and the first PS signal;
   a first secondary winding magnetically coupled to the first primary winding;
   a second primary winding adapted to receive the inverting RF signal and the second PS signal; and
   a second secondary winding magnetically coupled to the second primary winding, such that the first secondary winding and the second secondary winding are coupled in series and adapted to provide the RF output signal.

6. The circuitry of claim 5 wherein:
   a first end of the first primary winding is adapted to receive the non-inverting RF signal;
   a first end of the second primary winding is adapted to receive the inverting RF signal;
   a first end of the first secondary winding is adapted to provide the RF output signal;
   a first end of the second secondary winding is coupled to a ground;
   a second end of the first secondary winding is coupled to a second end of the second secondary winding;
   the first end of the first secondary winding is about phase-aligned to the first end of the first primary winding; and
   the first end of the second secondary winding is about phase-aligned to the first end of the second primary winding.

7. The circuitry of claim 1 wherein:
   the first PS signal has a first average voltage; and
   the second PS signal has a second average voltage, such that the second average voltage is about equal to the first average voltage.

8. The circuitry of claim 1 wherein the second ripple voltage is phase-shifted from the first ripple voltage by about 180 degrees.

9. The circuitry of claim 8 wherein a waveshape of the second ripple voltage is about equal to a waveshape of the first ripple voltage.

10. The circuitry of claim 1 wherein:
    the non-inverting RF signal and the inverting RF signal have amplitude modulation;
    the first PS signal and the second PS signal have amplitude modulation to provide envelope tracking; and
    a phase shift between the first ripple voltage and the second ripple voltage is adjusted based on the amplitude modulation of the first PS signal and the second PS signal.

11. The circuitry of claim 1 further comprising switching control circuitry, such that the non-inverting path PA circuitry is coupled between the switching control circuitry and the RF transformer circuitry, and the inverting path PA circuitry is coupled between the switching control circuitry and the RF transformer circuitry.

12. The circuitry of claim 11 wherein:
    the non-inverting path PA circuitry comprises a non-inverting path capacitive element and a non-inverting path inductive element, which is coupled between the non-inverting path capacitive element and the switching control circuitry;
    the inverting path PA circuitry comprises an inverting path capacitive element and an inverting path inductive element, which is coupled between the inverting path capacitive element and the switching control circuitry;
    the non-inverting path capacitive element is adapted to provide the first PS signal; and
    the inverting path capacitive element is adapted to provide the second PS signal.

13. The circuitry of claim 12 wherein:
    an input to the non-inverting path inductive element has a first inductor input voltage, such that the first ripple voltage is based on the first inductor input voltage;

an input to the inverting path inductive element has a second inductor input voltage, such that the second ripple voltage is based on the second inductor input voltage; and the second inductor input voltage is phase-shifted from the first inductor input voltage by about 180 degrees.

14. The circuitry of claim 13 wherein:

the first inductor input voltage is a periodic signal, such that during a first switching cycle period, the first inductor input voltage has a first peak voltage followed by a first valley voltage;

the second inductor input voltage is a periodic signal, such that during a second switching cycle period, the second inductor input voltage has a second peak voltage followed by a second valley voltage; and the second switching cycle period is about equal to the first switching cycle period.

15. The circuitry of claim 14 wherein:

the first inductor input voltage has the first peak voltage for a first discharge duration;

the first inductor input voltage has the first valley voltage for a first charge duration;

the second inductor input voltage has the second peak voltage for a second discharge duration;

the second inductor input voltage has the second valley voltage for a second charge duration;

the second discharge duration is about equal to the first discharge duration;

the second charge duration is about equal to the first charge duration; and the second peak voltage is about equal to the first peak voltage.

16. The circuitry of claim 12 wherein:

an input to the non-inverting path inductive element has a first inductor input voltage, such that the first ripple voltage is based on the first inductor input voltage;

an input to the inverting path inductive element has a second inductor input voltage, such that the second ripple voltage is based on the second inductor input voltage; and the second inductor input voltage is about phase-aligned to the first inductor input voltage.

17. The circuitry of claim 16 wherein:

the first inductor input voltage is a periodic signal, such that during a first switching cycle period, the first inductor input voltage has a first peak voltage followed by a first valley voltage;

the second inductor input voltage is a periodic signal, such that during a second switching cycle period, the second inductor input voltage has a second valley voltage followed by a second peak voltage;

the second switching cycle period is about equal to the first switching cycle period; and the second switching cycle period is about phase-aligned to the first switching cycle period.

18. The circuitry of claim 17 wherein:

the first inductor input voltage has the first peak voltage for a first discharge duration;

the first inductor input voltage has the first valley voltage for a first charge duration;

the second inductor input voltage has the second peak voltage for a second discharge duration;

the second inductor input voltage has the second valley voltage for a second charge duration;

the second charge duration is about equal to the first discharge duration; and the second discharge duration is about equal to the first charge duration.

19. The circuitry of claim 18 wherein:

a first difference is equal to the first peak voltage minus the first valley voltage;

a second difference is equal to the second peak voltage minus the second valley voltage;

a first product is equal to the first difference times the first discharge duration;

a second product is equal to the second difference times the second discharge duration; and the second product is about equal to the first product.

20. The circuitry of claim 18 wherein:

the first valley voltage is equal to about zero;

the second valley voltage is equal to about zero;

a first product is equal to the first peak voltage times the first discharge duration;

a second product is equal to the second peak voltage times the second discharge duration; and the second product is about equal to the first product.

21. A method comprising:

providing a non-inverting radio frequency (RF) signal to RF transformer circuitry;

providing a first power supply (PS) signal to the RF transformer circuitry, such that the first PS signal has a first ripple voltage;

providing an inverting RF signal to the RF transformer circuitry;

providing a second PS signal to the RF transformer circuitry, such that the second PS signal has a second ripple voltage; and additively combining the non-inverting RF signal and the inverting RF signal to provide an RF output signal, such that effects of the first ripple voltage and the second ripple voltage are substantially cancelled from the RF output signal.

22. Circuitry comprising:

non-inverting path power amplifier (PA) circuitry adapted to:
 provide a non-inverting radio frequency (RF) signal to RF transformer circuitry; and
 provide a first power supply (PS) signal to the RF transformer circuitry, such that the first PS signal has a first ripple voltage; and inverting path PA circuitry adapted to:
 provide an inverting RF signal to the RF transformer circuitry; and
 provide a second PS signal to the RF transformer circuitry, such that the second PS signal has a second ripple voltage, the RF transformer circuitry is adapted to additively combine the non-inverting RF signal and the inverting RF signal to provide an RF output signal, wherein effects of the first ripple voltage and the second ripple voltage are substantially cancelled from the RF output signal.

23. The circuitry of claim 22 further comprising a semiconductor die, which comprises at least a portion of the non-inverting path PA circuitry and at least a portion of the inverting path PA circuitry.

24. The circuitry of claim 23 wherein the semiconductor die comprises Silicon Germanium.

* * * * *